(12) United States Patent
Yang et al.

(10) Patent No.: US 9,374,112 B2
(45) Date of Patent: Jun. 21, 2016

(54) CAPTURE SELECTION FOR DIGITAL PRE-DISTORTION ADAPTATION AND CAPTURE CONCATENATION FOR FREQUENCY HOPPING PRE-DISTORTION ADAPTATION

(71) Applicant: Texas Instruments Incorporated, Dallas, TX (US)

(72) Inventors: Zigang Yang, Plano, TX (US); Raul Blazquez, Mountain View, CA (US); Hardik Prakash Gandhi, Sunnyvale, CA (US); Xiaohan Chen, Sunnyvale, CA (US); Lars Jorgensen, Royal Oaks, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/475,552

(22) Filed: Sep. 2, 2014

(65) Prior Publication Data
US 2016/0065249 A1 Mar. 3, 2016

(51) Int. Cl.
*H04L 25/49* (2006.01)
*H04B 1/04* (2006.01)
*H04W 88/08* (2009.01)

(52) U.S. Cl.
CPC .......... *H04B 1/04* (2013.01); *H04B 2001/0416* (2013.01); *H04B 2001/0425* (2013.01); *H04W 88/08* (2013.01)

(58) Field of Classification Search
CPC ............. H04B 1/04; H04B 2001/0425; H04B 2001/0416; H04W 88/08; H04L 25/03343; H03F 1/3247; H03F 1/3252
See application file for complete search history.

(56) References Cited

U.S. PATENT DOCUMENTS

| | | | | |
|---|---|---|---|---|
| 8,472,897 B1* | 6/2013 | Yang | ..................... | H03F 1/3247 330/149 |
| 2002/0080891 A1* | 6/2002 | Ahn | ....................... | H03F 1/3247 375/297 |
| 2004/0247042 A1* | 12/2004 | Sahlman | ............... | H03F 1/3247 375/297 |
| 2008/0130788 A1* | 6/2008 | Copeland | ...................... | 375/297 |
| 2009/0256630 A1* | 10/2009 | Brobston | .......................... | 330/2 |
| 2012/0194270 A1* | 8/2012 | Correa | .................. | H03F 1/3241 330/149 |

* cited by examiner

*Primary Examiner* — Syed Haider
(74) *Attorney, Agent, or Firm* — Ronald O. Neerings; Frank D. Cimino

(57) ABSTRACT

A digital pre-distortion component includes: a first capturing component that captures a first sample set of data; a first generating component that generates a first change matrix associated with a portion of the first sample set of data; a first memory component that stores the first change matrix; a second capturing component that captures a second sample set of data; a second generating component that generates a second change matrix associated with a portion of the second sample set of data; a second memory component that stores the second change matrix; a third capturing component that captures a third sample set of data; a third generating component that generates a third change matrix associated with a portion of the third sample set of data; a comparing component that compares the third change matrix with the first change matrix to obtain a first comparison, and compares the third change matrix with the second change matrix to obtain a second comparison; and an adapting component that adapts the digital pre-distortion component with the third sample set of data based on one of the first comparison and the second comparison.

20 Claims, 10 Drawing Sheets

Conventional DPD Adaption using Peak/RMS

CONVENTIONAL BRUTE FORCE FREQ. HOPPING ADAPTION (separate adaption for each hopping pattern)

FIG. 12

| Frequency hopping pattern in terms of center frequency locations (MHz) | (1)Brute-force solution (dBc) | (2)One solution apply to the rest (dBc) | (3)Concatenation w/o linear impairment model (dBc) | (4)Concatenation with linear impairment model (dBc) | |
|---|---|---|---|---|---|
| [-10,-6,-2,2,6,10] | -65.78 | -64.04 | -64.42 | -65.11 | 1214 |
| [-10,-8,-1,1,8,10] | -66.89 | -62.99 | -67.07 | -67.11 | 1216 |
| [-10,-8,-6,-4,-2,0] | -65.63 | -54.21 | -64.42 | -64.93 | 1218 |
| [0,2,4,6,8,10] | -64.18 | -58.10 | -60.42 | -64.41 | 1220 |
| [-10,-8,-6,6,8,10] | -68.11 | -62.89 | -65.63 | -67.40 | 1222 |
| [-10,-3,-1,1,3,10] | -69.07 | -63.94 | -66.74 | -68.15 | 1224 |
| [-10,-8,-4,2,6,8] | -64.39 | -60.98 | -63.40 | -64.61 | 1226 |

CAPTURE SELECTION FOR DIGITAL PRE-DISTORTION ADAPTATION AND CAPTURE CONCATENATION FOR FREQUENCY HOPPING PRE-DISTORTION ADAPTATION

BACKGROUND

The present invention generally relates to digital pre-distortion adaptation techniques for cellular base station power amplifiers.

Today's cellular base stations must be operated efficiently to minimize power dissipation and reduce the need for costly cooling equipment. Digital pre-distortion (DPD) plays a key role in correcting power amplifier (PA) nonlinear behavior and enabling PAs to operate with the high efficiency and linearity necessary to meet stringent adjacent channel leakage ratio (ACLR) specifications. Adaptive nonlinear systems that are periodically trained using snippets of the actively transmitted signal are very sensitive to the signal samples selected for adaptation (training). Digital pre-distortion for power amplifier linearization is one such system.

There are several conventional methods that select signal snippets for adaptation. These are conventionally based on the peak content in the signal and the average (RMS) power level. However, for systems with significant nonlinear memory, these metrics alone often come up short in being able to provide optimal performance that is stable over time.

Frequency hopping is used in multicarrier wireless systems, to improve the signal to noise ratio in a link by adding frequency diversity. Signal fading can occur when the signal from a wireless system base station reflects from multiple surfaces, e.g. buildings, vehicles, such that the multiple reflected signals arrive at the same receiving point having different path lengths and therefore different phases. These multiple reflected signals interfere with each other and, depending on the phase relationships between the signals, the addition of the out-of-phase multiple signals can cause both constructive and destructive interference. When destructive interference occurs, signal amplitude is reduced and thus signal fading occurs. Frequency diversity, i.e. changing the carrier frequency, combats such fading since it also changes the phase relationships between the reflected signals. In multicarrier wireless systems, the frequencies of the carriers are constantly exchanged with each other over time in a repeating pattern. This is known as "frequency hopping" and the repeating pattern is known as a "hopping pattern". In addition, the hopping patterns themselves are changed over time. Carrier frequency changes and pattern changes are done synchronously on pre-determined time boundaries.

Out of all applied cellular standards, multicarrier wireless systems require the most stringent ACLR regulatory requirements as compared to typical 3G or 4G systems. How to design DPD components for multicarrier wireless hopping systems has been one of the most challenging problems faced by the industry in the recent past. DPD performance in multicarrier wireless hopping systems is very often used as a metric to evaluate different DPD solutions for use across different platforms.

The conventional method for choosing snippets or captures of signal for DPD adaptation, as mentioned, is to base the choice on the peak and RMS power content. This can be further explained with a diagram.

FIG. 1 shows a system 100 of a conventional DPD adaptation system using peak and RMS power thresholds for choosing signal captures for training.

System 100 includes DPD component 104, a transmitter/PA component 113, a signal tap component 117, a capture filter component 118 and an adaptation component 134. Transmitter/PA component 113 includes a transmitter 108 and a PA 112. Signal tap component 117 includes a coupler 120 and a receiver 124. Capture filter component 118 further includes a comparator 128 and a storage component 130.

DPD component 104 is arranged to input a signal on a line 102 for transmission and to output a signal on a line 106 to transmitter 108. Transmitter 108 is arranged to connect to PA 112, via line 110. PA 112 is arranged to connect to antenna 116 via a line 114, which also passes through coupler 120. Receiver 124 is arranged to input a signal on a line 122 from coupler 120 and connects to comparator 128 via a line 126. Storage component 130 connects to capture component 128 via a line 129. Comparator 128 is arranged to output a signal on a line 132 to adaptation component 134. Adaptation component 134 outputs a signal on a line 136 to DPD component 104.

DPD component 104 is operable to pre-distort an input signal. Transmitter 108 is operable to provide digital-to-analog (D/A) conversion and frequency up-conversion functions. PA 112 is operable to provide RF signal amplification. Antenna 116 is operable to transmit an RF signal over the air. Coupler 120 is operable to tap off a small portion of the power of an input signal and to pass through the remainder of the power. Receiver 124 is operable to provide down-conversion and analog-to-digital (A/D) conversion functions. Comparator 128 is operable to capture a snippet of an input signal in time, to compare properties of the capture against predetermined thresholds and to filter out undesired captures. Storage component 130 is operable to store and provide signal property threshold values. Adaptation component 134 is operable provide DPD adaptation signals based on signal captures at its input and to provide adaptation timing and synchronization.

DPD component 104, transmitter 108, PA 112 and antenna 116 form the transmit chain for a cellular base station radio. Line 102 carries the digital signal input intended for transmission via the transmit chain. Transmitter 108 converts the digital signal into an analog signal and up-converts the analog signal to radio frequencies (RF) on line 110. The upconverted signal is then sent to PA 112 for amplification before it is transmitted over the air via antenna 116. However, since PA 112 is operated in its most efficient region i.e. the non-linear high gain region, its input must be conditioned in order to compensate for the non-linearities of the PA's gain response. This compensation is performed by DPD component 104. DPD component 104 modifies the input signals on line 102 to produce compensated signals on line 106. The compensation is such that when a signal on line 110, which is the D/A converted and up-converted version of signal 106, passes through PA 112 in its nonlinear region, the result approximates the undistorted signal passing through a PA with a linear gain response.

The pre-distortion applied by DPD component 104 needs to be adapted over time due to changes in the input signal properties and behavior changes over time in the analog system, especially PA. To accomplish this, a portion of the transmitted signal is captured and its properties used for the adaptation. Coupler 120 taps a portion of the power of the signal 114 and this is fed through receiver 124 which applies frequency down-conversion and A/D conversion to produce signal 126, which, in effect, for the tapped off signal, "undoes" the D/A conversion and upconversion performed by transmitter/PA 113. Therefore, signal 126 can be considered a replica of signal 106. Comparator 128 captures and stores a slice in time, or snippet, of signal 126, then determines the peak and average RMS values within the snippet. The peak and average RMS values in the snippet, being representative of those of signal 106, can then be used as properties to perform DPD adaptation.

Empirical testing has shown that not all captures can yield good results when used for adaptation and that captures need to be individually selected for this purpose. In this conventional system, captures are selected on the basis of the peak and average RMS powers contained in the capture and the threshold values of these properties which have been determined as the criteria for selection have themselves been determined empirically.

In operation, storage component 130 holds the peak and RMS thresholds used and supplies the values to comparator 128 which then, by comparing them to the values obtained from the snippet via signal 126, uses them to determine the suitability of the capture for adaptation use. Comparator 128 then filters out those which do not meet the thresholds and so have been found not suitable. The remaining captures are passed to adaptation component 134 which determines the changes needed to the adaptation method and communicates these changes to DPD component 104 via signal 136.

For systems, especially those with significant nonlinear memory, these metrics alone (peak and RMS power) can often come up short in being able to provide optimal performance which is stable over time.

In frequency hopping systems such as multicarrier wireless systems, DPD adaptation to the different hopping patterns can also present problems. Existing solutions can use a synchronous memory and processing-intensive method or use fast re-adaptation along with PA back-off, a method which offers significantly lower power efficiency. The conventional method to overcome such problems is known as the "brute force" method, whereby a different DPD solution for each hopping pattern has to be applied each time there is a new hopping pattern transmitted.

FIG. 2 shows a block diagram 200 which illustrates the treatment of different hopping patterns by the "brute force" method.

In the figure, block diagram 200 includes system 100, a system 202 and a system 204. System 100, as described for FIG. 1, includes DPD component 104, transmitter/PA 113, signal tap component 117, capture filter component 118, and adaptation component 134. Both system 202 and system 204 include the components of system 100. System 202 and system 204 represent system 100 at a later time in a frequency hopping pattern sequence.

Line 102, line 106, line 110, line 114, line 132 and line 136 of system 100, system 202 and system 204 are arranged in the same manner as for system 100 of FIG. 1.

System 100 is operable exactly as described for system 100 in FIG. 1. System 202 and system 204 are both identically operable as system 100.

As described earlier, in multicarrier wireless systems, frequency hopping is the practice of exchanging the frequencies of the multiple carriers with each other over time in a repeating pattern and that the hopping patterns themselves are changed over time. For example, a wireless channel may be assigned four carrier frequencies $f_1$, $f_2$, $f_3$ and $f_4$ will change between those frequencies in order on pre-determined time boundaries and the pattern will repeat constantly. At another time, the channel may have the hopping pattern $f_5$, $f_6$, $f_7$ and $f_8$ will behave in the same manner. It should be noted that the frequency pattern is chosen such that the same frequency is not being used twice at any one time. In addition, the patterns themselves can change over time such that there is a repeating sequence of patterns. For example, the channel may change from pattern $f_1$, $f_2$, $f_3$, $f_4$ to pattern $f_5$, $f_6$, $f_7$, $f_8$, then to $f_1$, $f_3$, $f_5$, $f_7$ then to $f_2$, $f_4$, $f_6$, $f_8$. There may also be additional patterns. The pattern changes, as for the frequency changes, must be done synchronously on pre-determined time boundaries.

Referring again to the figure, system 100, system 202 and system 204, while identically operable, differ in that each is configured to handle a different frequency hopping pattern from a sequence of N patterns. System 100 is configured to handle a hopping pattern 206, the first hopping pattern, system 212 is configured to handle a hopping pattern 208, the second hopping pattern and system 222 is configured to handle a hopping pattern 210, the $N^{th}$ hopping pattern.

From the figure, at time $t_1$ for system 100, DPD adaptation to the properties of hopping pattern 206 starts at the time that a hopping pattern change occurs and hopping pattern 206 begins. Sometime later, at time $t_2$, the hopping pattern changes from hopping pattern 206 to hopping pattern 208 and DPD adaptation also changes, illustrated by system 202. DPD adaptation changes then occur for every hopping pattern change until, at time $t_3$, the hopping pattern changes to hopping pattern 208, the $N^{th}$ hopping pattern, illustrated by system 204. The hopping sequence itself then starts repeating.

It should be noted that in cellular conventional systems hopping pattern changes are done with reference to available system timing signal boundaries, such as numbered frame or superframe boundaries. In addition, channel frequency assignment information which is necessary to implement frequency hopping changes is made available to all the components which require it.

Each time there is a hopping pattern change, a new method must be loaded into DPD component 104 and feedback processor 113 must be loaded with new thresholds as directed by adaptation component 134. Such changes must occur instantaneously, necessitating preloading of methods and thresholds into ready-to-go buffers. Changes must also occur synchronously requiring timing circuitry within timing component 134. Conventional solutions for multicarrier wireless frequency hopping solutions therefore can require relatively heavy resources for processing, storage and timing.

One problem with conventional DPD adaptation techniques is that the results can often fall far short of optimal performance. Additionally, in multicarrier wireless frequency hopping applications using conventional DPD adaptation techniques, the processing, memory and timing circuitry required to implement conventional brute-force techniques can be very intensive.

What is needed is a system and method which can evaluate signal captures for their suitability for DPD adaptation which eliminates many of the performance problems of conventional systems and methods. What is also needed, when frequency hopping is present, is a system and method which would eliminate much of the hardware required by conventional systems and methods.

BRIEF SUMMARY

The present invention provides a unique system and method for testing signal captures for their suitability for DPD adaptation in multi-carrier wireless systems base stations in which the RF power amplifier is operated in its most efficient but non-linear gain region. The present invention further provides a unique system and method for DPD adaptation in frequency hopping multi-carrier wireless applications.

Aspects of the present invention are drawn to the provision of a digital pre-distortion (DPD) component, a signal capturing component, a matrix generator, a memory component, a comparator and an adaptation component. These components are arranged and operable to capture transmitted wireless signals from a base station, for example a cellular base station, and to evaluate the captures for suitability for training of (or adaptation of) a pre-distortion method, which then modifies the transmit signal such that the base station's RF power amplifier can operate in its nonlinear region without causing large amounts of interference in adjacent channels. The aspects of the present invention represent a significant improvement over conventional DPD adaptation techniques which can often be inadequate in their attempts to linearize nonlinear power amplifier performance.

Other aspects of the present invention are drawn to the concatenation of signal captures in order to arrive at a single DPD adaptation solution for multiple hopping patterns in a frequency hopping multicarrier wireless environment, and also to the addition of an error modeling component to further improve the DPD adaptation solution by cancelling linear errors present in the captures. The aspects achieve similar performance results to conventional "brute force" techniques but use significantly fewer processing and circuit resources.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate exemplary embodiments of the present invention and, together with the description, serve to explain the principles of the invention. In the drawings:

FIG. 12 shows a table listing results of testing in a frequency hopping multicarrier wireless environment under conventional conditions versus conditions in accordance with aspects of the present invention.

DETAILED DESCRIPTION

Figure 1:
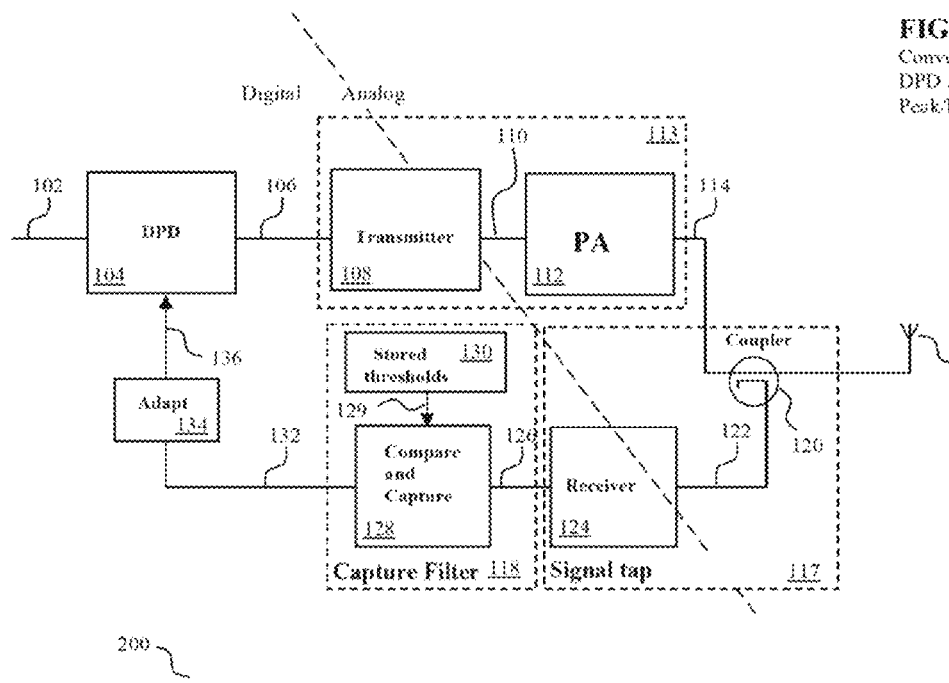
FIG. 1 shows a system for a conventional DPD adaptation using peak and RMS power thresholds for choosing signal captures for training.
Figure 2:
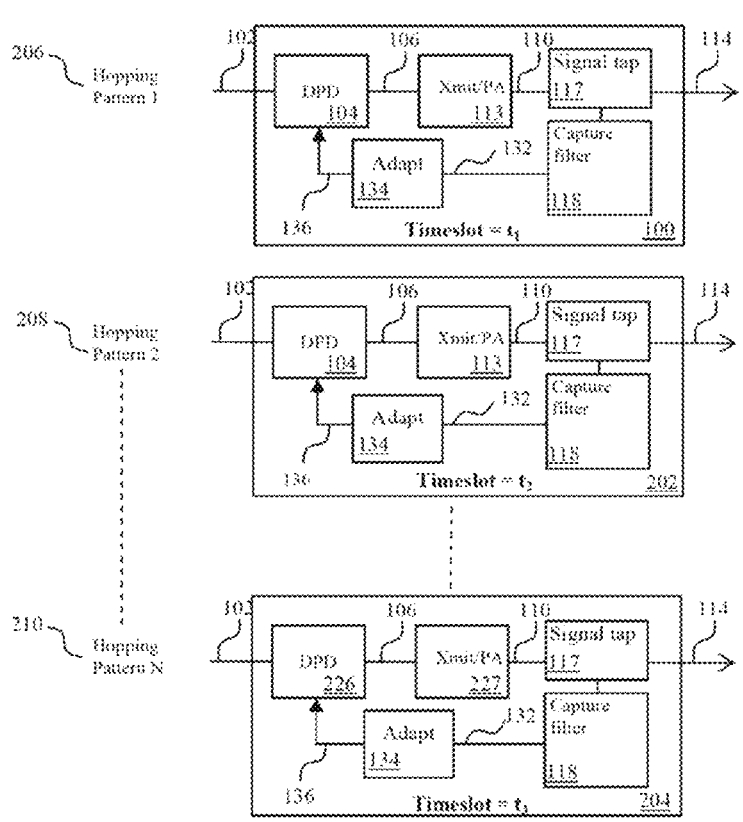
FIG. 2 shows a block diagram illustrating the treatment of different hopping patterns by the conventional "brute force" method of DPD adaptation.

A first aspect of the present invention is drawn to a digital pre-distortion (DPD) component that modifies the transmit signal of a wireless system base station such that its RF power amplifier can operate in its nonlinear region without causing unacceptable interference in adjacent channels. The DPD component is periodically trained (called "adaptation") using amplitude change matrices derived from captured transmit signals and selected based on a comparison with a priori acceptable and non-acceptable captured signals.

A second aspect of the invention is drawn to a signal capturing component, a matrix generator, a memory component and a comparator. Transmitted wireless signals from the base station are captured, and from which, amplitude change matrices are generated. The memory component stores empirically evaluated reference amplitude change matrices that are tagged with their empirically evaluated results, i.e. good result or bad result. The comparator compares the current capture's amplitude change matrix with the reference matrices, and selects the capture to send to the adaptation component based on the mathematical distances between the current matrix and the good and bad reference matrices. Those matrices selected are used for DPD adaptation and others are filtered out.

It will be shown how the first and the second aspects of the present invention described above provide a system and method for DPD adaptation which yields significantly better adjacent channel leakage ratio (ACLR) results than conventional systems and methods.

A third aspect of the invention is drawn to use of the first and second aspects in conjunction with a new and unique DPD adaptation technique used for frequency hopping multicarrier wireless applications. Properties of signal captures taken from transmitted signals, each representing a different transmitted hopping pattern taken from a sequence of hopping patterns, are combined or "concatenated" to form a signal capture representing all the hopping patterns. This then becomes a single DPD adaptation solution for all the hopping patterns in the sequence.

A fourth aspect of the present invention is drawn to the use of the third aspect in conjunction with an additional linear error modeling component which, by cancelling the linear errors present in the concatenated capture of the third aspect, achieves a marked improvement in the DPD adaptation results of the third aspect.

It will be shown how the third and fourth aspects of the present invention described above provide a system and method for DPD adaptation in multicarrier frequency hopping wireless networks which can achieve ACLR results comparable to conventional "brute force" technique results, but with advantage that significantly reduced hardware and processing resources are used.

Aspects of the present invention will now be described with reference to FIGS. 3-12.

A first aspect of the present invention will be described in greater detail with reference to FIGS. 3-9.

Figure 3:
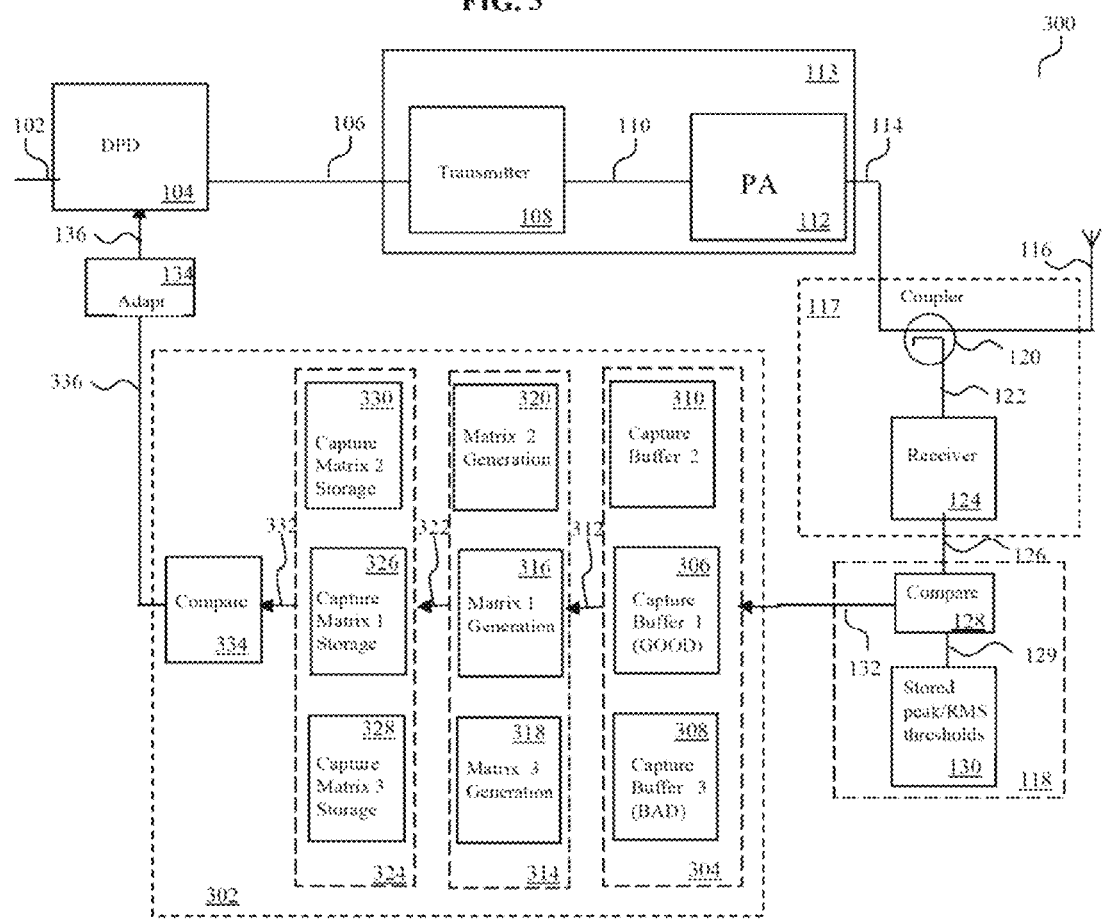
FIG. 3 illustrates a system in accordance with the first and second aspects of the present invention.

FIG. 3 shows a block diagram 300 illustrating a system in accordance with the first and second aspects of the present invention.

As shown in the figure, system 300 includes digital pre-distortion (DPD) component 104, transmitter/PA component 113, signal tap component 117, capture filter 118 and adaptation component 134. Transmitter/PA component 113 includes transmitter 108 and PA 112. Signal tap component 117 includes coupler 120 and receiver 124. Capture filter 118 includes comparator 128 and storage component 130. Referring briefly to FIG. 1, these components also form system 100 which is a conventional system. Referring back to FIG. 3, system 300 additionally includes a second capture filter 302. Capture filter 302 includes a capture component 304, a matrix generation component 314, a memory component 324 and a comparator 334. Capture component 304 includes a capture buffer 306, a capture buffer 308 and a capture buffer 310. Matrix generation component 314 includes a matrix generator 316, a matrix generator 318 and a matrix generator 320. Storage component 324 includes a memory 326, a memory 328 and a memory 330.

In this example, DPD component 104, transmitter 108, PA 112, antenna 116, receiver 124, comparator 128, storage component 130, capture buffer 306, capture buffer 308, capture buffer 310, matrix generation component 316, matrix generation component 318, matrix generation component 320, memory 326, memory 328, memory 330, comparator 334 and adaptation component 134 are distinct components. However, in other examples, at least two of DPD component 104, transmitter 108, PA 112, antenna 116, receiver 124, comparator 128, storage component 130, capture buffer 306, capture buffer 308, capture buffer 310, matrix generation component 316, matrix generation component 318, matrix generation component 320, memory 326, memory 328, memory 330, comparator 334 and adaptation component 134 may be combined as a unitary component. Further, in some examples, at least one of DPD component 104, transmitter 108, PA 112, antenna 116, receiver 124, comparator 128, storage component 130, capture buffer 306, capture buffer 308, capture buffer 310, matrix generation component 316, matrix generation component 318, matrix generation component 320, memory 326, memory 328, memory 330, comparator 334 and adaptation component 134 may be implemented as non-transient, tangible computer-readable media for carrying or having computer-executable instructions or data structures stored thereon. Such non-transient, tangible computer-readable media can be any available media that can be accessed by a general purpose or special purpose computer. Non-limiting examples of non-transient, tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (hardwired and/or wireless, or a combination of hardwired or wireless) to a computer, the computer properly views the connection as a non-transient, tangible computer-readable media computer-medium. Thus, any such connection is properly termed a non-transient, tangible computer-readable medium. Combinations of the above should also be included within the scope of non-transient, tangible computer-readable media.

DPD component 104, transmitter 108, PA 112, antenna 116, coupler 120, receiver 124 comparator 128, adaptation component 134 and DPD component 104 are arranged in the same manner as in FIG. 1, except that capture filter 302 is arranged between comparator 128 and adaptation component 134 via line 132 and line 336. Within capture filter 302, capture component 304 is arranged to connect between comparator 128 via signal 129 and matrix generation component 314 via line 312. Matrix generation component 314 connects to storage component 324 via line 322 and connects to comparator 334 via line 332.

DPD component 104, transmitter 108, PA 112, antenna 116, coupler 120, receiver 124, comparator 128 storage component 130 and adaptation component 134 are identically operable as described for FIG. 1.

Capture buffer 306, capture buffer 308 and capture buffer 310 are operable to hold captures received via line 132. Matrix generator 316, matrix generator 318 and matrix generator 320 are all operable to generate an amplitude change matrix from a signal capture received at line 312. Memory 326, memory 328 and memory 330 are all operable to store capture amplitude change matrices received via line 322.

System 300 operates the same as system 100 except that an additional stage of adaptation suitability selection has been added. In the interests of brevity, the operation of the portion of system 300 which duplicates system 100 will not be described again. However, the additional stage of capture selection represented by capture filter 302 will be described.

As shown in FIG. 3, in operation, transmitted signal captures which have been selected, as described in FIG. 1, for suitability for DPD adaptation by comparison with peak and RMS thresholds are passed on to capture filter 302 for additional filtering in accordance with aspects of the present invention. Within capture filter 302, capture buffer 306 holds reference captures which have been previously recorded and shown to have yielded good performance results when used for DPD adaptation. Similarly, capture buffer 308 holds reference captures which have previously yielded bad results. Capture buffer 310 holds the capture which is under evaluation.

Matrix generator 316, matrix generator 318 and matrix generator 320 generate amplitude change matrices derived from the captures in capture buffer 306, capture buffer 308 and capture buffer 310, respectively.

Noting that a capture sample is one unit of a capture and represents a symbol of transmitted data, amplitude change matrix generation will now be explained.

Let $x[n]$, for $n=0, \ldots, N-1$, be the contiguous transmitted complex samples associated to a capture buffer. Let $y[n]$, for $n=0, \ldots, N-1$, be the received samples, properly aligned to the $x[n]$ and scaled to minimize the quadratic error between the two.

If M is the number of quantization intervals considered, let $A=\{a_0, a_1, a_2, \ldots, a_{M-1}, a_M\}$ be a set of thresholds that meet the following properties:
$a_{i-1} < a_i$ for $i=1, 2, \ldots, M$
$a_0=0$, $a_M=A$, with A being the maximum amplitude considered for the samples.

From the set A, a set of intervals may be defined so that a sample $x[n]$ belongs to interval, if $a_{i-1} \leq |x[n]| < a_i$. This definition allows for non-uniform intervals.

Now, let d be an integer. The amplitude change matrix, H, is obtained by the following procedure:
first, $H(i,j)$ is initialized. $H(i,j)=0$ for all $i=0, \ldots, M-1$ and $j=0, \ldots, M-1$;
then, for $n=d, \ldots, N-1$,
let i indicate the interval such that $a_{i-1} \geq |x[n-d]| < a_i$.
let j indicate the interval such that $a_{j-1} \leq |x[n]| < a_j$, and
$H(i,j)=H(i,j)+f(x[n], x[n-d], y[n], y[n-d])$, where this function f may be any real function of the two complex samples.

Examples $f(x[n], x[n-d], y[n], y[n-d])=1 \Rightarrow$ This would correspond to a histogram.

$f(x[n], x[n-d], y[n], y[n-d])=\text{conj}(x[n])^*x[n] =>$ energy per bin.

$f(x[n], x[n-d], y[n], y[n-d])=\text{conj}(x[n]-y[n])^*(x[n]-y[n])$ => error energy per bin.

If the collection of samples is comprised of multiple time intervals, an $H_t$ matrix will be calculated for each interval t independently and then the amplitude matrix for all the intervals will be obtained as: $H=\Sigma_t H_t$ A simple variation is to use y[n] and y[n-d] for (1) and (2) instead of x[n] and x[n-d], i.e., replace the transmitted samples for the received samples to determine which cell of the matrix the pair of samples belong.

The preceding paragraphs show an example procedure to obtain the amplitude change matrix for both reference captures and captures under examination, given a number of quantization intervals M, a set of thresholds A, and a real function $f$ of two complex samples. This may be applied to any wireless signal. Further, in some embodiments the change matrix may be associated with a contiguous portion of the capture. In some embodiments, the change matrix may be associated with multiple sub-segments of the capture. In some embodiments, the change matrix may be associated with the entire capture.

Returning to FIG. 3, storage component 324 stores the generated matrices. Memory 326 stores the "good" matrix, memory 328 stores the "bad" matrix and memory 330 stores the matrix under evaluation. Comparator 334 then compares the matrix under evaluation with the "good" matrix by calculating the mathematical distance between the two matrices. Next, comparator 334 then compares the matrix under evaluation with the "bad" matrix by calculating the mathematical distance between those two matrices. The distance used in this embodiment for a measure of the closeness of two matrices is the Euclidian distance, but this is not meant to be limiting since other types of distance measurement may be used.

Thus, a metric representing how close the matrix under evaluation is to a reference matrix which has previously yielded good results is made, and similarly a metric representing how close the matrix under evaluation is to a reference matrix which has previously yielded bad results is made. These metrics are then used to determine the suitability of the capture under evaluation for DPD adaptation. For this embodiment, for the capture under evaluation, if the capture's amplitude change matrix is closer to the "good" reference matrix than it is to the "bad" reference matrix, then the capture is qualified for use for DPD adaptation and is passed on to adaptation component 134 in order to be used to modify DPD component 104. If the capture's amplitude change matrix is closer to the "bad" reference matrix than it is to the "good" reference matrix, then the capture is discarded. In other embodiments, other selection thresholds may be used.

The components of capture filter 302 of FIG. 3 have been used demonstrate the operation of the first and second aspects of the present invention. In steady state operation in the field, however, the components used for the reference "good" and "bad" captures and matrix generation are not required since reference capture processing and evaluation is, in practice, performed in a lab environment prior to steady state operation.

Figure 4:
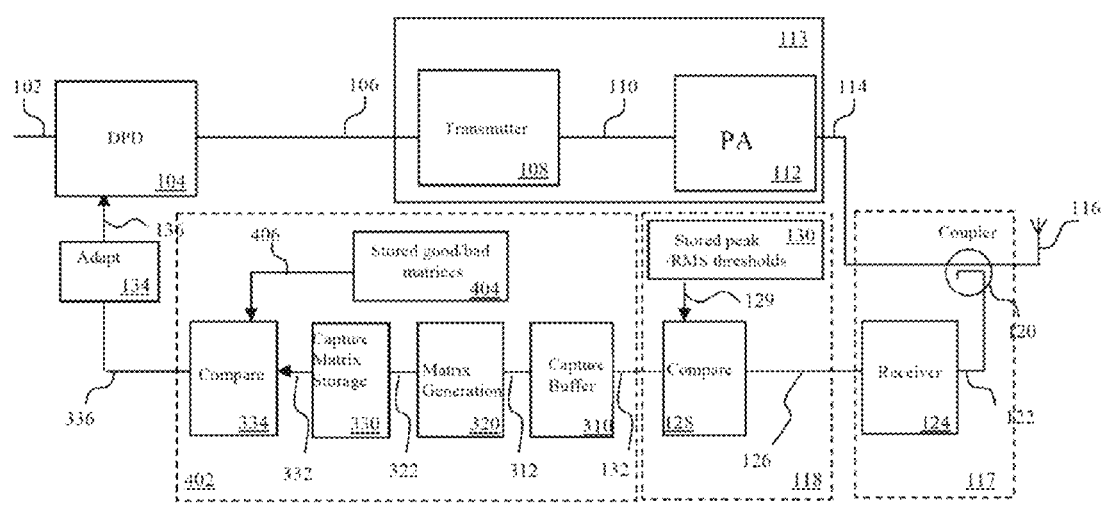
FIG. 4 shows a system embodiment in accordance with the first and second aspects of the present invention intended for steady state operation.

FIG. 4 is a block diagram showing system 400, a system embodiment in accordance with the first and second aspects of the present invention and intended for steady state operation.

System 400 is the same as system 300 except that capture filter 302 has been replaced by capture filter 402. In the interests of brevity, the list and description of components other than capture filter 402 and which are common between system 400 and system 300 will not be repeated.

Capture filter 402 includes capture buffer 310, matrix generator 320, memory 330, comparator 334 and memory 404.

In this example, DPD component 104, transmitter 108, PA 112, antenna 116, receiver 124, comparator 128, storage component 130, capture buffer 310, matrix generation component 320, memory 330, comparator 334, memory 404 and adaptation component 134 are distinct components. However, in other examples, at least two of DPD component 104, transmitter 108, PA 112, antenna 116, receiver 124, comparator 128, storage component 130, capture buffer 310, matrix generation component 320, memory 330, comparator 334, memory 404 and adaptation component 134 may be combined as a unitary component. Further, in some examples, at least one of DPD component 104, transmitter 108, PA 112, antenna 116, receiver 124, comparator 128, storage component 130, capture buffer 310, matrix generation component 320, memory 330, comparator 334, memory 404 and adaptation component 134 may be implemented as non-transient, tangible computer-readable media for carrying or having computer-executable instructions or data structures stored thereon.

Capture buffer 310 is arranged to connect between comparator 128 via signal 132 and matrix generator 320 via line 312. Matrix generator 320 connects to memory 330 via line 322 and connects to comparator 334 via line 332. Comparator 334 also connects to memory 404 via line 406 and to adaptation component 134 via line 336.

Comparator 128, matrix generator 320, memory 330, comparator 334 and adaptation component 134 are all operable as described for system 300 of FIG. 3. Memory 404 is operable to store reference matrices.

It should be noted that system 300 is an embodiment intended to illustrate all the functions of the aspects of the present invention in one place, irrespective of when the functions are performed. System 400 on the other hand, represents an alternate embodiment of system 300 whereby "good" and "bad" reference matrices have previously been determined in a laboratory environment. Therefore, system 400 performs only the "steady state" actions.

In operation, whereas system 300 provides the functions to capture, generate amplitude change matrices and store "good" and "bad" reference matrices, system 400 only stores them. For system 400, reference amplitude distance matrices for "good" and "bad" cases have been pre-determined empirically and are pre-loaded directly into memory 404. System 400 therefore draws its "good" and "bad" reference matrices from memory 404 for comparison with the matrices derived from real-time captures, but otherwise operates in the same manner as system 300.

Figure 5:
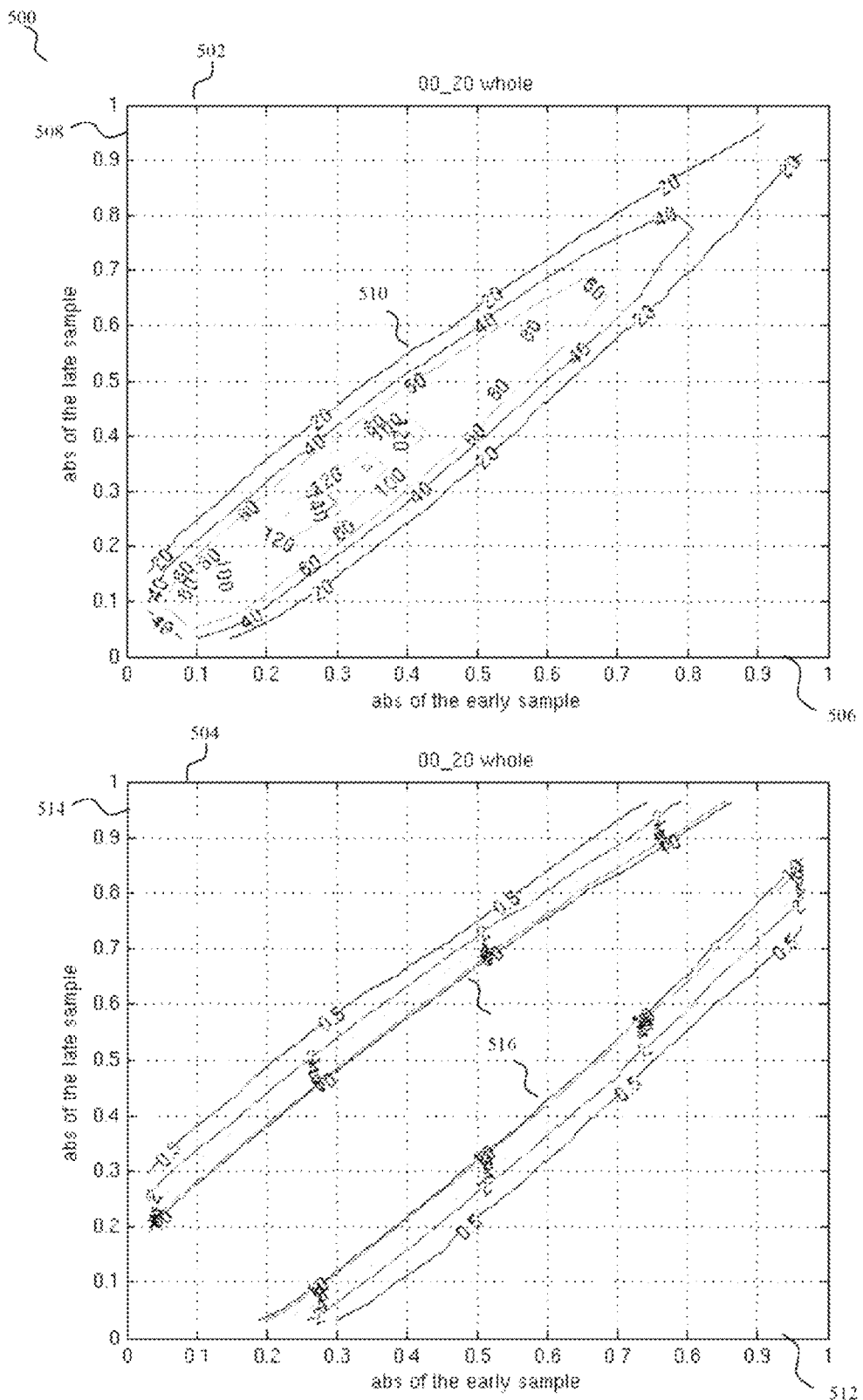
FIG. 5 shows contour plots for an example "good" amplitude change matrix.

FIG. 5 shows example 500 illustrating contour plots for an example "good" amplitude change matrix.

As shown in the figure, example 500 includes a plot 502 and a plot 504. Plot 502 includes an x-axis 506, a y-axis 508 and a contour set 510. Plot 504 includes an x-axis 512, a y-axis 514 and a contour set 516.

X-axis 506 and x-axis 512 represent early sample absolute value which is equivalent to the quantization interval i of an amplitude change matrix H(i,j) described for FIG. 5. Y-axis 508 and Y-axis 514 represent late sample absolute value which is equivalent to the quantization interval j of an amplitude change matrix H(i,j) described for FIG. 5. Contour set 510 is a way or representing that the amplitude matrix for a good capture buffer has the largest values in the diagonal of the plot, with a maximum around x=0.3, y=0.3, and showing that the outside of the diagonal values decrease sharply. Contour set 516 show the values below 10 (516 and 510 refer to the same change matrix) proving that most of the change matrix, outside of the main diagonal have values close to zero.

Plot 502 and plot 504, respectively, represent the same amplitude change matrix associated to two wireless signals with 20 dB difference in power, each with 5 MHz bandwidth and separated to occupy a total bandwidth of 20 MHz.

Figure 6:
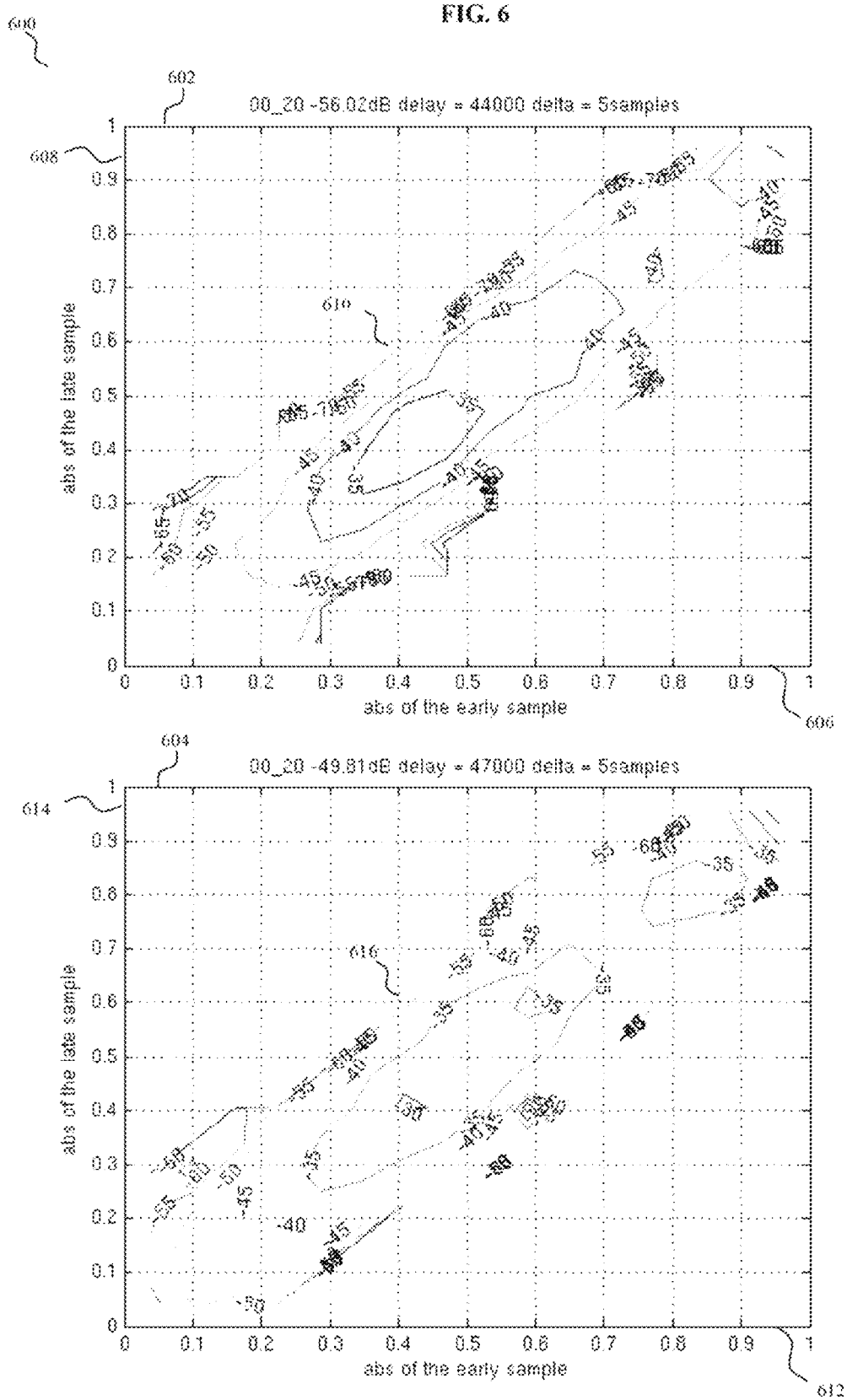
FIG. 6 shows contour plots for an example "bad" amplitude change matrix.

FIG. 6 shows example 600 illustrating contour plots for an example "bad" amplitude change matrix.

As shown in the figure, example 600 includes a plot 602 and a plot 604. Plot 602 includes an x-axis 606, a y-axis 608 and a contour set 610. Plot 604 includes an x-axis 612, a y-axis 614 and a contour set 616.

X-axis 606 and x-axis 612 represent early sample absolute value which is equivalent to the quantization interval i of an amplitude change matrix H(i,j) described for FIG. 5. Y-axis 608 and Y-axis 614 represent late sample absolute value which is equivalent to the quantization interval j of an amplitude change matrix H(i,j) described for FIG. 5. Contour set 610 is a way of representing that the amplitude matrix for a bad capture buffer has a more irregular distribution of values, in which there are multiple local maximums that have moved to higher values of x and y, and they decrease in a more irregular way as they move away from the main diagonal.

Example 600 uses an amplitude change matrix which is different from the one used in example 500. Plot 602 and plot 604 represent the same amplitude change matrix associated to the same two Wideband Code Division Multiple Access (WCDMA) signals used in example 500, which have 20 dB difference in power, each with 5 MHz BW and separated to occupy a total BW of 20 MHz.

Examples of the properties of a good amplitude change matrix known to yield good DPD performance results and one known to yield bad performance results have been shown. These results can be further illustrated using a graph. It should be noted that the WCDMA signals used to generate the examples of FIGS. 5 and 6 are merely used for purposes of explanation. Aspects of the present invention may be applicable to any system with real time changes in frequency distribution of the signal. For example, OFDM signals like those used in Long Term Evolution (LTE) systems may have different groups of sub carriers active at different times. Further, future shared or un-licenced spectrum applications may have signals moving around in frequency to occupy spectrums with best SNR qualities.

Figure 7:
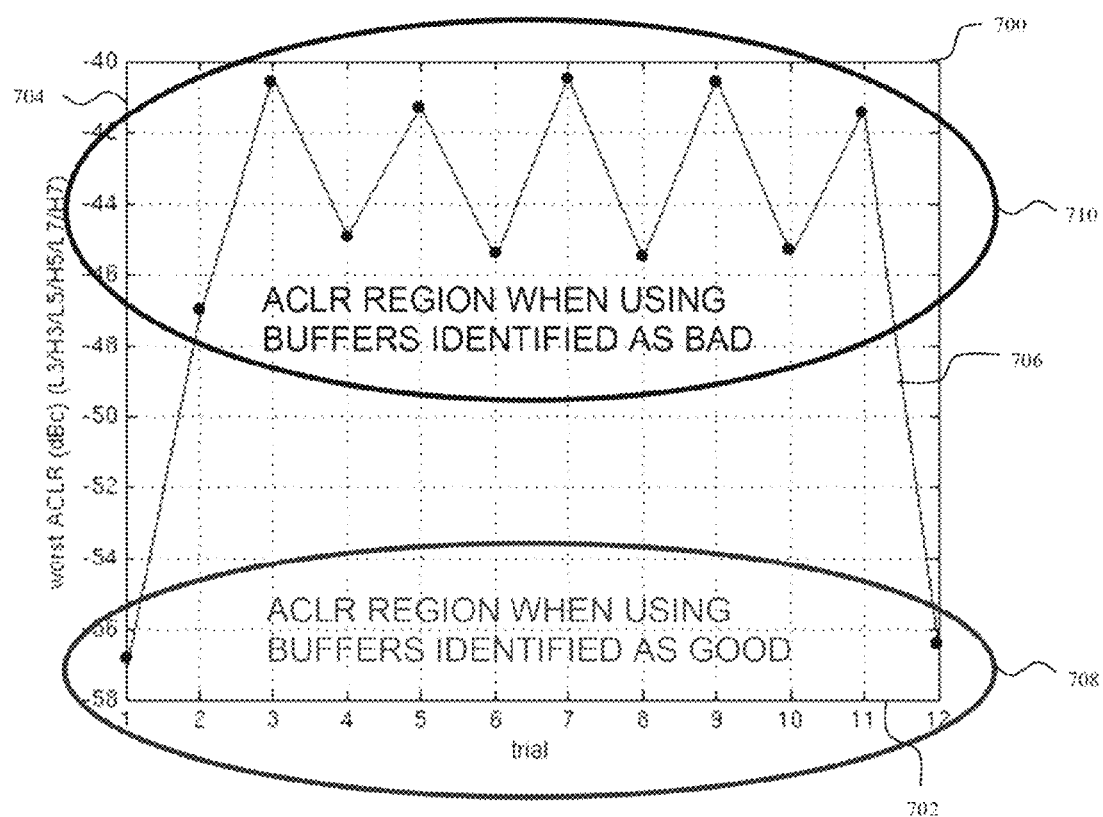
FIG. 7 is a graph illustrating the performance results of DPD adaptation trials based on "good" amplitude change matrixes and "bad" amplitude change matrices.

FIG. 7 is a graph 700, illustrating the performance results of DPD adaptation trials based on "good" amplitude change matrixes and "bad" amplitude change matrices.

As shown in the figure, graph 700 includes an x-axis 702, a y-axis 704, a plot 706, a region 708 and a region 710.

X-axis 702 represents empirical trials numbered 1 through 12. Y-axis 704 represents ACLR expressed in dBc. Plot 700 plots the values of the worst ACLR results from each of the trials 1 through 12. Region 708 encapsulates the plotted points obtained using amplitude change matrices derived from capture buffers deemed as "good". Region 710 encapsulates the plotted points obtained using amplitude change matrices derived from capture buffers deemed as "bad".

Graph 700 represents the results of performing twelve DPD performance trials each using a different amplitude change matrix derived from capture buffers determined to be either "good" or "bad" in accordance with aspects of the present invention. Trial 1 and trial 12 both used "good" matrices. The remaining trials, 2 through 11, used "bad" matrices. As shown in the figure, the worst ACLR results within region 708 are approximately −57 dBc and −56.5 dBc from trial 1 and trial 12 respectively, while the worst ACLR results within region 710 from trials 2 through 11 vary between approximately −47 dBc and −40.5 dBc.

As shown in the figure and using the results from trials 1 through 12, there is a 10 dB to 16 dB improvement in ACLR performance over conventional means using systems and methods in accordance with the present invention. This is a significant improvement.

The operation and performance of system 400 of FIG. 4 has been described above using FIG. 4, FIG. 5, FIG. 6 and FIG. 7. An alternate embodiment of FIG. 4 will now be described.

Referring briefly to FIG. 4, system 400 includes two capture filters. Firstly, capture filter 118, a conventional capture filter using peak and RMS power thresholds, and secondly, capture filter 402, a capture filter in accordance with aspects of the present invention. In another embodiment, the conventional capture filter can be eliminated so that only capture filter 402 provides the filtering to select capture buffers for DPD adaptation.

Figure 8:
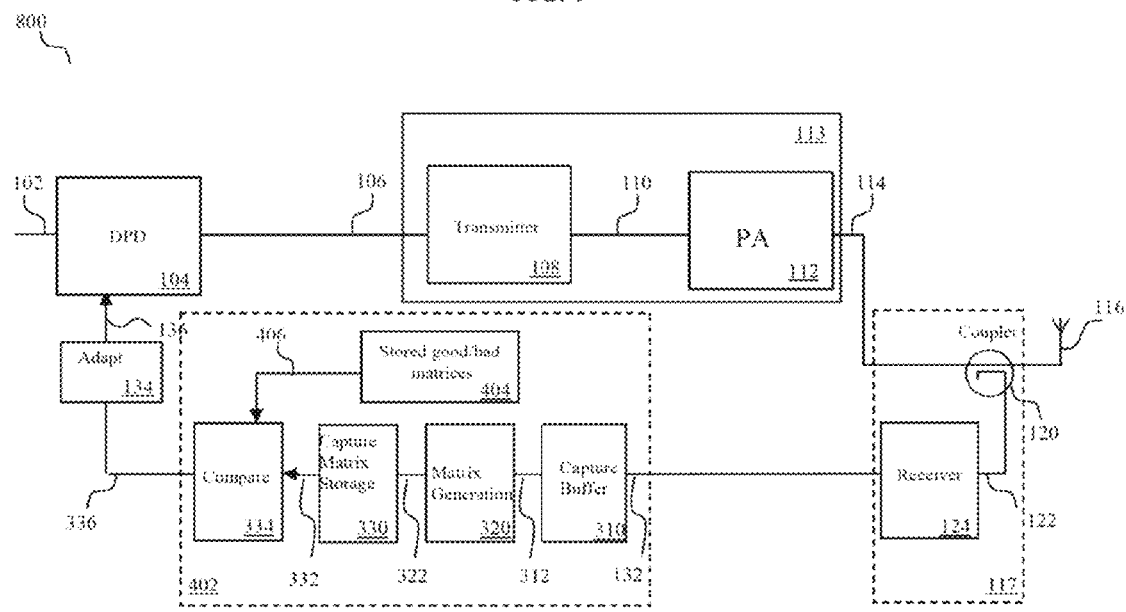
FIG. 8 shows a system embodiment in accordance with the first and second aspects of the present invention but without conventional capture selection.

FIG. 8 shows system 800, an embodiment in accordance with the first and second aspects of the present invention without conventional capture selection.

All components of system 800 have already been described for system 400 of FIG. 4. All components of system 800 are arranged in the same manner as for system 400, except that capture buffer 310 is arranged to take its input directly from receiver 124 since capture filter 118 components are absent from this example embodiment. All components of system 800 are operable as described for system 400.

System 800 operates in the same manner as system 400 except that signal captures from receiver 124 are not pre-filtered in the conventional manner, e.g. using peak and RMS powers. Therefore, in this embodiment, capture filter 402 now has the freedom to consider the entire unfiltered signal stream output from receiver 124.

It has been shown using FIG. 3 through FIG. 8 how a system and method in accordance with the first and second aspects of the present invention can provide a large improvement in adjacent channel performance of a wireless system employing DPD as compared with conventional systems and methods. Novel features and advantages afforded by a system and method in accordance with the third and fourth aspects of the present invention will now be further described. The third and fourth aspects extend the invention to include multicarrier wireless applications by providing additional new and unique approaches to handle the frequency hopping inherent in those applications.

The third aspect of the invention is drawn to addressing errors associated with frequency hopping. For example, suppose one capture is transmitted at a frequency $f_1$ and a following capture is transmitted at frequency $f_2$. Transmission errors develop based not only on the relationship between $f_1$ and $f_2$, but with the specific data within each capture. As such, those same two previous captures if transmitted at frequencies $f_3$ and $f_4$, respectively (as opposed to frequencies $f_1$ and $f_2$, respectively) may result in different transmission errors. Therefore the possible errors exponentially increases as the number of different possible captures increase and the number of different possible frequency hops increase. Training a DPD with each of these possible errors would take unrealistic resources.

The third aspect of the present invention involves a DPD adaptation technique whereby subsets of signal captures taken from transmitted signals, each subset representing a different transmitted hopping pattern taken from a sequence of hopping patterns, are concatenated to form a "complete" signal capture which is then be used as a DPD adaptation solution for all the hopping patterns in the sequence. Therefore single optimized error may be used to train the DPD for all captures. The method to combine the captures from different hopping patterns is described below.

Figure 9:
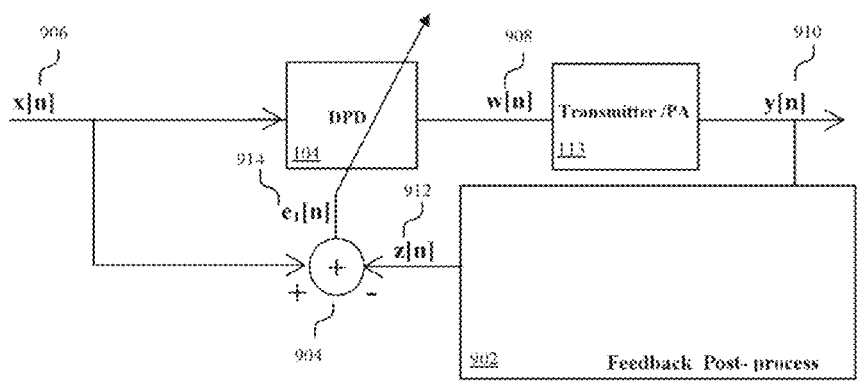
FIG. 9 is a diagram showing a DPD adaptation model in accordance with aspects of the present invention.

FIG. 9 is a diagram 900 showing a DPD adaptation model in accordance with aspects of the present invention.

As shown in the figure, diagram 900 includes DPD component 104, transmitter/PA component 113, a feedback post-process component 902, and an adder component 904.

In this example, DPD component 104, transmitter 108, PA 112, antenna 116, receiver 124, capture filter 118, capture filter 402, adder component 904 and adaptation component 134 are distinct components. However, in other examples, at least two of DPD component 104, transmitter 108, PA 112, antenna 116, receiver 124, capture filter 118, capture filter 402, adder component 904 and adaptation component 134 may be combined as a unitary component. Further, in some examples, at least one of DPD component 104, transmitter 108, PA 112, antenna 116, receiver 124, capture filter 118, capture filter 402, adder component 904 and adaptation component 134 may be implemented as non-transient, tangible computer-readable media for carrying or having computer-executable instructions or data structures stored thereon.

Signal 906 (x[n]) is the transmit reference signal before digital pre-distortion, signal 908 (w[n]) is the transmit signal after digital pre-distortion, signal 910 (y[n]) is the transmit signal after amplification, signal 912 (z[n]) is the transmit signal after feedback post processing and signal 914 ($e_1$[n]) is the error signal from adder component 904. DPD component 104 and transmitter/PA are operable as described above in FIG. 1. Feedback post-process component 902 is operable to process a portion of the amplified transmit signal for DPD adaptation. Adder component 904 is operable to add or subtract its input signals and output the result.

In FIG. 9, input signal x[n], signal 906, is processed by DPD component 104, and transmitter/PA 113. Feedback data z[n], signal 912, is post processed to be aligned in delay, phase and gain with signal x[n], such normalization being necessary to compute the error between them.

Assume that there are a total of N hopping patterns, Note that for each hopping pattern, the feedback data is a nonlinear function of the reference data and the unknown parameter set $\vec{\theta}$. It can be approximated through linearization:

$$\vec{z}_n = \vec{f}(\vec{x}_n, \vec{\theta}) + \vec{v}_n \quad (1)$$
$$= \vec{f}(\vec{x}_n, \vec{\theta}_{k-1}) + H_k(\vec{x}_n) \cdot (\vec{\theta} - \vec{\theta}_{k-1}) + \vec{v}_n,$$

where H is the Jacobian matrix and defined as $$H_k(\vec{x}_n) = \left. \frac{\partial \vec{f}(\vec{x}_n, \vec{\theta})}{\partial \vec{\theta}} \right|_{\vec{\theta}, \vec{\theta}_{k-1}}$$

The goal is to find the solution $\vec{\theta}$ that minimizes the error power between the feedback data and the reference across all hopping patterns. The cost function $\zeta$ is given by $$\zeta = \sum_{n=1}^{N} |\vec{e}_n|^2 = \sum_{n=1}^{N} |(\vec{x}_n - \vec{z}_n)|^2 \quad (2)$$

Based on the measurement model (1), different adaptation methods can be derived. An example of a gradient approach is given to show how Jacobian matrix $H_k(\vec{x}_n)$ and error vector $\vec{e}_x$ can be used to form the adaptive solution. Formulation of a bigger Jacobian matrix H, a longer error vector and signal vectors gives:

$$H = \begin{bmatrix} H(\vec{x}_1) \\ H(\vec{x}_2) \\ \vdots \\ H(\vec{x}_N) \end{bmatrix}; \vec{e} = \begin{bmatrix} \vec{e}_1 \\ \vec{e}_2 \\ \vdots \\ \vec{e}_N \end{bmatrix}; \vec{x} = \begin{bmatrix} \vec{x}_1 \\ \vec{x}_2 \\ \vdots \\ \vec{x}_N \end{bmatrix}; \vec{z} = \begin{bmatrix} \vec{z}_1 \\ \vec{z}_2 \\ \vdots \\ \vec{z}_N \end{bmatrix} \quad (3)$$

Each of the items in equation 3 are concatenations of their respective individual vector elements. The gradient approach tries to move the solution in the direction opposite to the gradient vector with a step size proportional to the inverse of the Hessian, which is given by:

$$\vec{\theta}_{k+1} = \vec{\theta}_k - \mu(\nabla^2 \zeta)^{-1} \cdot \nabla \zeta, \quad (4)$$

where $\vec{x}$ is the vector representation of the unknown parameters; $\nabla \zeta$ is the gradient; and $\nabla^2 \zeta$ is the Hessian. The gradient of cost function can be approximated by:

$$\nabla \zeta = 2 J^H \vec{e} \quad (5)$$

The Hessian of the cost function can be approximated by:

$$\nabla^2 \zeta = 2 J^H \cdot J \quad (6)$$

Given that:

$$J = \frac{\partial \vec{e}}{\partial \vec{\theta}} = \frac{\partial (\vec{x} - \vec{z})}{\partial \vec{\theta}} = -\frac{\partial \vec{z}}{\partial \vec{\theta}} = -H \quad (7)$$

Therefore, the gradient solution becomes:

$$\vec{\theta}_k = \vec{\theta}_{k-1} - \mu (J^H \cdot J)^{-1} \cdot J^H \cdot \vec{e} \quad (8)$$
$$= \vec{\theta}_{k-1} + \mu (H^H \cdot H)^{-1} \cdot H^H \cdot \vec{e}$$

Although the total number of possible hopping patterns N can be very large, they actually occupy only limited bandwidth. As long as most of the frequency locations are covered, the solution is quite reasonable in many other combinations.

In accordance with this aspect, there are multiple captures and perform a joint optimization. Once the cost function is formulated, as discussed above with reference to equation (2), then the gradient solution becomes standard. By concatenating multiple captures, the solution jointly minimizes the total adaptation error for all the hopping pattern captures.

It is known that impairments in power amplifier operation drift with time and it has been found empirically that linear distortion drifts much faster than the non-linear portion. If the linear drift is mitigated or eliminated, i.e., not used in training the DPD, then the results from concatenation can be substantially improved. The fourth aspect of the present invention addresses linear distortion and attempts to remove it from the DPD training. This is achieved through modeling of the linear error, removing the linear error, so the error used to train the DPD is a linear impairment error. This aspect of the present invention will be described in greater detail with reference to FIGS. 10-12.

Figure 10:
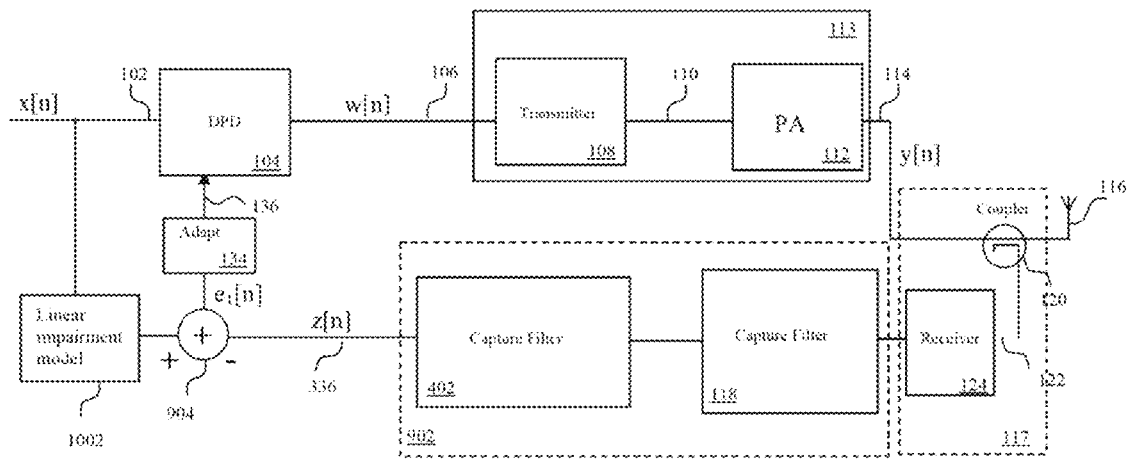
FIG. 10 shows a system in accordance with aspects of the present invention which mitigates PA linear distortion.

FIG. 10 shows a system 1000 in accordance with aspects of the present invention, which removes linear distortion from DPD training.

As shown in the figure, system 1000 includes the components of system 400 of FIG. 4. These components, their arrangements and operability have already been described and will not be described again in the interests of brevity. System 1000 additionally includes adder component 904 and linear impairment model component 1002.

In this example, DPD component 104, transmitter 108, PA component 112, capture filter 118, capture filter 402, adder component 904, linear impairment model component 1002 and adaptation component 134 are distinct components. However, in other examples, at least two of DPD component 104, transmitter 108, PA component 112, capture filter 118, capture filter 402, adder component 904, linear impairment model component 1002 and adaptation component 134 may be combined as a unitary component. Further, in some examples, at least one of DPD component 104, transmitter/PA component 113, feedback post-process component 902, linear impairment model component 1002 and adder component 904 may be implemented as non-transient, tangible computer-readable media for carrying or having computer-executable instructions or data structures stored thereon.

Adder component 904 is arranged between capture filter 402 and adaptation component 134. Linear impairment component 1002 is arranged between line 102 and adder component 904. Adder component 904 is operable to add or subtract its inputs and output a result. Linear impairment model component 1002 is operable to apply a model of linear impairment to an input signal and output a result.

Operationally, system 1000 works as system 900 and system 400, except that the fast drifting linear impairment inherent in the PA operating in a non-linear region is eliminated. This is achieved by estimating a linear impairment model for each capture time and applying the model before calculating the distortion error. For system 1000, this is done by linear impairment model component 1002, which applies the impairment model to the reference signal x[n] which appears on line 102. At adder component 904, the natural linear impairment on signal z[n] is subtracted from the modeled linear impairment which has been applied to signal x[n], effectively cancelling out the linear impairments appearing on signal $e_1[n]$.

As just described, in this embodiment the linear impairment model is applied to the reference signal x[n]. The same results can be obtained in another embodiment, by applying the linear impairment model in the feedback loop.

Figure 11:
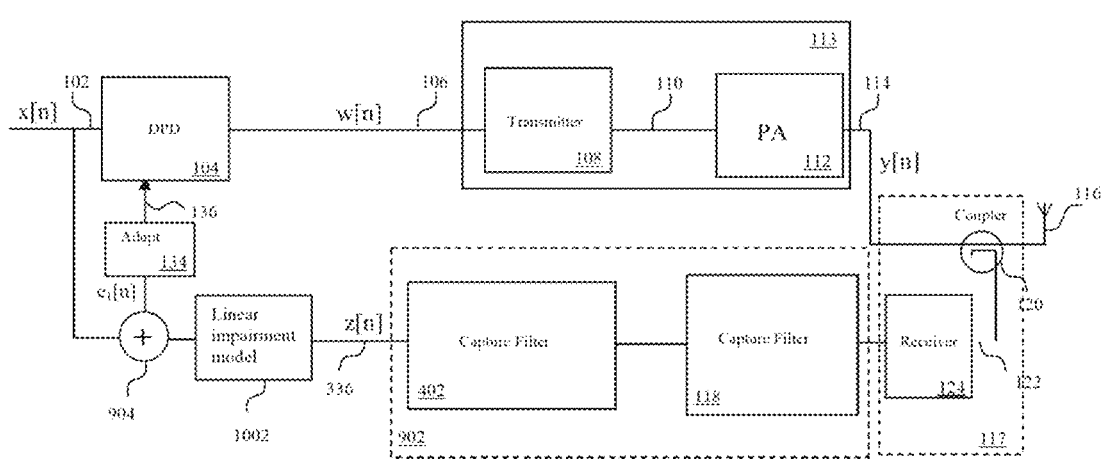
FIG. 11 shows a system that applies the linear impairment model in the feedback loop.

FIG. 11 shows system 1100, which applies the linear impairment model in the feedback loop.

As shown in the figure, system 1100 is a version of system 1000 which includes the same components as system 1000, these components being identically operable as for system 1000, and arranged identically with one exception. The exception is that linear impairment component 1002 is arranged between capture filter 402 and adder component 904 instead of being arranged between line 102 and adder component 904. Line 102 connects directly to adder component 904

So, for system 1100 the change of arrangement means that the linear impairment model is now applied in the feedback loop to z[n] instead of to the reference signal x[n]. System 1100 is an alternate embodiment to system 1000 and produces the same results.

The third and fourth aspects of the present invention and their advantages for frequency hopping multicarrier GSM applications have been described above. Empirical testing has been performed to confirm the stated advantages. These are shown in a figure.

FIG. 12 shows table 1200 listing results of testing in a frequency hopping multicarrier wireless environment under conventional conditions versus conditions in accordance with aspects of the present invention.

As shown in the figure, table 1200 includes a column 1202, a column 1204, a column 1206, a column 1208 a column 1210, a row 1212, a row 1214, a row 1216, a row 1218, a row 1220, a row 1222, a row 1224 and a row 1226.

Row 1212 is the header row for the table. Column 1202 lists the frequency hopping patterns for which the testing was performed.

Columns 1204 through 1210 list the results of ACLR testing using various systems to perform DPD adaptation. All results are in dBc. Column 1204 lists the results for the testing done using a conventional brute-force system. Column 1206 lists the results obtained using a conventional system whereby the solution for one hopping pattern is applied to all the other hopping patterns. Column 1208 lists the results obtained using a system in accordance with the third aspect of the present invention. Column 1210 lists the results obtained using a system in accordance with the third and the fourth aspects of the present invention.

It can be seen from the table that the worst results (highest ACLR number) are in column 1206, these results being obtained using a conventional system and method whereby the best solution from the first hopping pattern (row 1214) is applied for all the other hopping patterns (rows 1216 through 1226). Better results are obtained using a system and method in accordance with the third aspect of the present invention as shown in column 1208. The results in column 1204 and column 1210 are very similar. The best results, therefore, are obtained using not only concatenation and linear impairment modeling (i.e. a system and method in accordance with the third and fourth aspect of the present invention) as shown in column 1210 but also a conventional brute-force system and method as shown in column 1204.

It was described earlier that a problem with the conventional "brute-force" system and method is its need for intensive hardware resources. The test results shown in FIG. 12 illustrate that equivalent performance can be obtained using a system and method in accordance with the third aspect of the present invention (concatenation) and the fourth aspect of the present invention (linear impairment modeling) which, since there is no need to process, store and load a separate solution for every frequency hopping pattern in real time, has the significant advantage of using far less memory and processing hardware than the conventional system and method.

It was described earlier that there is also a problem achieving consistent good adjacent channel performance results when using a conventional DPD adaptation system and methods which employ peak and average RMS power thresholds to ascertain the suitability of signal captures for DPD training. It has been shown how a system and method in accordance with the first and second aspects of the present invention can overcome these performance problems by providing an additional capture filter based on comparison with "good" and "bad" reference matrices and how these provide a large improvement in adjacent channel performance of a wireless system employing DPD.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of training a digital pre-distortion component comprising:
    capturing, via a first capturing component, a first sample set of received data;
    generating, via a first generating component, a first change matrix associated with a portion of the first sample set of received data;
    storing, into a first memory component, the first change matrix;
    capturing, via a second capturing component, a second sample set of received data;
    generating, via a second generating component, a second change matrix associated with a portion of the second sample set of received data;
    storing, into a second memory component, the second change matrix;
    capturing, via a third capturing component, a third sample set of received data;
    generating, via a third generating component, a third change matrix associated with a portion of the third sample set of received data;
    comparing, via a comparing component, the third change matrix with the first change matrix to obtain a first comparison;
    comparing, via the comparing component, the third change matrix with the second change matrix to obtain a second comparison; and
    adapting, via an adapting component, a digital pre-distortion component with the third sample set of data based on one of the first comparison and the second comparison.

2. The method of training a digital pre-distortion component of claim 1,
    wherein said capturing a first sample set of data, said capturing a second sample set of received data and said capturing a third sample set of received data are performed such that the first capturing component, the second capturing component and the third capturing component are a first unitary component,
    wherein said generating a first change matrix, said generating a second change matrix and said generating a third change matrix are performed such that the first generating component, the second generating component and the third generating component are a second unitary component, and
    wherein said storing the first change matrix, said storing the second change matrix and said storing the third change matrix are perforated such that the first memory component, the second memory component and the third memory component are a third unitary component.

3. The method of training a digital pre-distortion component of claim 2, wherein said generating, via a first generating component, a first change matrix associated with a portion of the first sample set of received data comprises generating first the change matrix associated with a contiguous portion of the first sample set of received data.

4. The method of training a digital pre-distortion component of claim 2, wherein said generating, via a first generating component, a first change matrix associated with a portion of the first sample set of received data comprises generating first the change matrix associated with the entire portion of the first sample set of received data.

5. The method of training a digital pre-distortion component claim 2, wherein said generating, via a first generating component, a first change matrix associated with a portion of the first sample set of received data comprises generating first the change matrix associated with multiple sub-segments of the first sample set of received data.

6. The method of training a digital pre-distortion component of claim 2, wherein said generating, via a first generating component, a first change matrix associated with a portion of the first sample set of received data comprises generating an amplitude change matrix.

7. The method of training a digital pre-distortion component of claim 1, wherein said generating, via a first generating component, a first change matrix associated with as portion of the first sample set of received data comprises generating first the change matrix associated with a contiguous portion of the first sample set of received data.

8. The method of training a digital pre-distortion component of claim 1, wherein said generating, via a first generating component, a first change matrix associated with a portion of the first sample set of received data comprises generating first the change matrix associated with the entire portion of the first sample set of received data.

9. The method of training a digital pre-distortion component of claim 1, wherein said generating, via a first generating component, a first change matrix associated with a portion of the first sample set of data comprises generating first the change matrix associated with multiple sub-segments of the first sample set of received data.

10. The method of training a digital pre-distortion component of claim 1, wherein said generating, via a first generating component, a first change matrix associated with a portion of the first sample set of received data comprises generating an amplitude change matrix.

11. The method of training a digital pie-distortion component of claim 10, further comprising:
    modeling, via a feedback component, error;
    determining, via a linear error determining component, a linear error portion of the modeled error; and
    generating, via an error generating component, a linear impairment error based on the error absent the linear error portion,
    wherein said adapting, via the adapting component, the digital pre-distortion component with the third sample set of data based on one of the first comparison and the second comparison comprises adapting the digital pre-distortion component additionally based on the linear impairment error.

12. The method of training a digital pre-distortion component of claim 1, further comprising:
    modeling, via a feedback component, error;
    determining, via a linear error determining component, a linear error portion of the modeled error; and
    generating, via an error generating component, a linear impairment error based on the error absent the linear error portion,
    wherein said adapting, via the adapting component, the digital pre-distortion component with the third sample set of data based on one of the first comparison and the second comparison comprises adapting the digital pre-distortion component additionally based on the linear impairment error.

13. A digital pre-distortion component trainer comprising:
a digital pre-distortion component;
a first capturing component configurable to capture a first sample set of received data;
a first generating component configurable to generate a first change matrix associated with a portion of the first sample set of received data;
a first memory component configurable to store the first change matrix;
a second capturing component configurable to capture a second sample set of received data;
a second generating component configurable to generate a second change matrix associated with a portion of the second sample set of received data;
a second memory component configurable to store the second change matrix;
a third capturing component configurable to capture a third sample set of received data;
a third generating component configurable to generate a third change matrix associated with a portion of the third sample set of received data;
a comparing component configurable to compare the third change matrix with the first change matrix to obtain a first comparison, and to compare the third change matrix with the second change matrix to obtain a second comparison; and
an adapting component configurable to adapt said digital pre-distortion component with the third sample set of data based on one of the first comparison and the second comparison.

14. The digital pre-distortion component trainer of claim 13,
wherein said first capturing component, said second capturing component and said third capturing component are a first unitary component,
wherein said first generating component, said second generating component and said third generating component are a second unitary component; and
wherein said first memory component, said second memory component and said third memory component are a third unitary component.

15. The digital pre-distortion component trainer of claim 13, wherein said first generating component is operable to generate the first change matrix associated with a contiguous portion of the first sample set of received data.

16. The digital pre-distortion component trainer of claim 13, wherein said first generating component is operable to generate the first change matrix, associated with the entire portion of the first sample set of received data.

17. The digital pre-distortion component trainer of claim 13, wherein said first generating component is operable to generate the first change matrix associated with multiple sub-segments of the first sample set of received data.

18. The digital pre-distortion component trainer of claim 13, further comprising:
a feedback component operable to model error;
a linear error determining component operable to determine a linear error portion of the modeled error; and
an error generating component operable to generate a linear impairment error based on the error absent the linear error portion,
wherein said adapting component is operable to adapt said digital pre-distortion component with the third sample set of data additionally based the linear impairment error.

19. The digital pre-distortion component trainer of claim 13, wherein said generating component is operable to generate the first change matrix as an amplitude change matrix.

20. A method of training a digital pre-distortion component comprising:
capturing, via a first capturing component a first sample set of received data;
generating, via a feedback component, a first error associated with a portion of the first sample set of received data;
capturing, via a second capturing component, a second sample set of received data;
modeling, via the feedback component, a second error associated with a portion of the second sample set of received data;
determining, via a linear error determining component, a linear error portion of the first error and the modeled second error;
generating, via an error generating component, a linear impairment error based on the second modeled error absent the linear error portion; and
adapting, via an adapting component, a digital pre-distortion component based on the linear impairment error.

* * * * *